(12) United States Patent
Tsai

(10) Patent No.: US 9,602,071 B2
(45) Date of Patent: Mar. 21, 2017

(54) FILTER WITH ELECTROSTATIC DISCHARGE PROTECTION

(71) Applicant: TAIWAN SEMICONDUCTOR MANUFACTURING CO., LTD., Hsinchu (TW)

(72) Inventor: Ming-Hsien Tsai, New Taipei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 14/688,926

(22) Filed: Apr. 16, 2015

(65) Prior Publication Data
US 2016/0308503 A1  Oct. 20, 2016

(51) Int. Cl.
| | | |
|---|---|---|
| *H02H 9/00* | (2006.01) | |
| *H02H 9/04* | (2006.01) | |
| *H03H 1/00* | (2006.01) | |
| *H03H 9/46* | (2006.01) | |
| *H01F 38/14* | (2006.01) | |

(52) U.S. Cl.
CPC ............ *H03H 1/0007* (2013.01); *H01F 38/14* (2013.01); *H02H 9/04* (2013.01); *H03H 9/46* (2013.01); *H01F 2038/146* (2013.01)

(58) Field of Classification Search
CPC ................ H01L 27/0255; H01L 27/0288
USPC ............ 333/175, 12; 361/56, 91.1, 111
See application file for complete search history.

(56) References Cited

U.S. PATENT DOCUMENTS

| | | | | |
|---|---|---|---|---|
| 7,005,939 B2* | 2/2006 | Zerbe | ................. | H01L 27/0251 333/100 |
| 7,057,472 B2 | 6/2006 | Fukamachi et al. | | |
| 7,907,924 B2* | 3/2011 | Kawasaki | ............ | H03H 7/0115 327/551 |
| 8,279,570 B2* | 10/2012 | Lin | ......................... | H01L 23/60 361/111 |

(Continued)

FOREIGN PATENT DOCUMENTS

KR    20140114386 A2    9/2014

OTHER PUBLICATIONS

An On-Chip Electromagnetic Bandgap Structure Using an On-Chip Inductor and a MOS Capacitor (Chulsoon Hwang et al., IEEE Microwave and Wireless Components Letters, vol. 21, No. 8, August 2011).

*Primary Examiner* — Dean Takaoka
(74) *Attorney, Agent, or Firm* — Maschoff Brennan

(57) ABSTRACT

An electronic device is disclosed that includes a power distribution network, a first resonant network, a second resonant network, and a third resonant network. The power distribution network is configured transmit a voltage. The first resonant network is coupled to a first terminal of the power distribution network, and is configured to provide a first electrostatic discharge (ESD) protection to the power distribution network. The second resonant network is coupled to a second terminal of the power distribution network, and is configured to provide a second ESD protection to the power distribution network. The third resonant network coupled between the first terminal and the second terminal of the power distribution network, and the first resonant network, the second resonant network, and the third resonant network are configured to filter an AC signal from the power distribution network.

20 Claims, 6 Drawing Sheets

(56) References Cited

U.S. PATENT DOCUMENTS

| | | | |
|---|---|---|---|
| 8,680,940 B2* | 3/2014 | Morris, III | H03H 7/383 |
| | | | 333/32 |
| 8,792,218 B2* | 7/2014 | Tsai | H01L 27/0251 |
| | | | 361/111 |
| 9,118,176 B2* | 8/2015 | Kim | H02H 9/044 |
| 9,281,681 B2* | 3/2016 | Chu | H02H 9/046 |
| 9,337,157 B2* | 5/2016 | Ma | H01L 23/60 |
| 2012/0002392 A1 | 1/2012 | Karp et al. | |
| 2013/0163127 A1* | 6/2013 | Chu | H02H 9/046 |
| | | | 361/56 |
| 2014/0036396 A1* | 2/2014 | Jin | H03H 7/40 |
| | | | 361/56 |

* cited by examiner

FILTER WITH ELECTROSTATIC DISCHARGE PROTECTION

BACKGROUND

With the rapid development of manufacturing technology, operating speed of integrated circuits has been significantly improved. In a high speed digital system, performance of the system suffers from certain undesired effects including, for example, power fluctuation.

In related approaches, when power fluctuation occurs in the system, the operating speed of the system becomes unstable. Furthermore, when electrostatic discharge event occurs in the system, reliability of the system is reduced.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
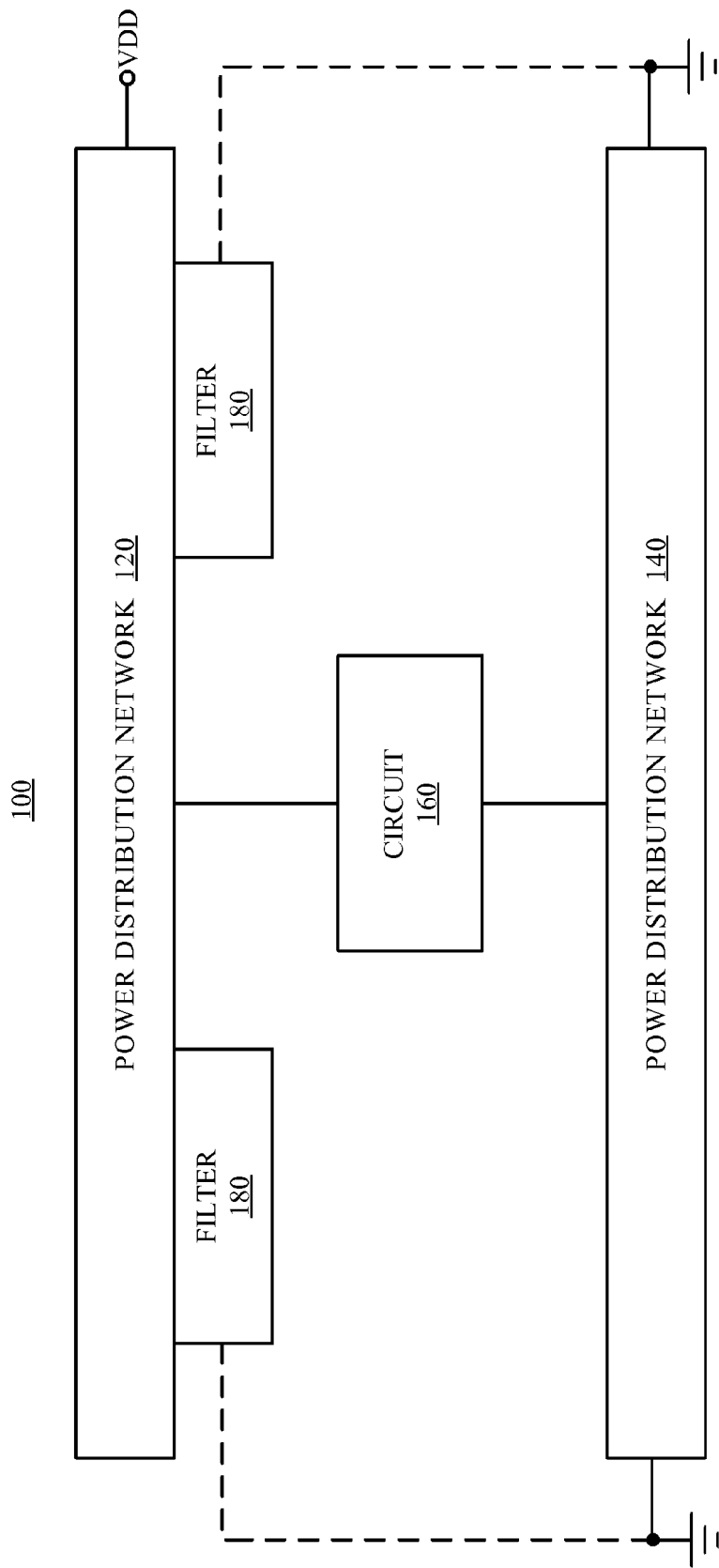
FIG. 1 is a schematic diagram of an electronic device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

FIG. 1 is a schematic diagram of an electronic device 100, in accordance with some embodiments of the present disclosure.

As illustratively shown in FIG. 1, the electronic device 100 includes a power distribution network 120, a power distribution network 140, a circuit 160, and filters 180. In some embodiments, the power distribution network 120 and the power distribution network 140 are formed with power planes. In further embodiments, the power planes are formed with transmission lines. In even further embodiments, the transmission lines are implemented with metal layers. In various embodiments, the power distribution network 120 and the power distribution network 140 are power buses.

For simplicity, the power distribution network 120 and the power distribution network 140 in FIG. 1 are illustrated as power planes. Various configurations of the power distribution network 120 and the power distribution network 140 are within the contemplated scope of the present disclosure.

For illustration, the power distribution network 120 is configured to receive a system voltage VDD. The power distribution network 140 is coupled to ground. The circuit 160 is coupled between the power distribution network 120 and the power distribution network 140. The circuit 160 is configured to be directly or indirectly driven by the system voltage VDD transmitted through the power distribution network 120.

In some embodiments, the circuit 160 includes at least one passive circuit. In some other embodiments, the circuit 160 includes at least one active circuit. For illustration of the circuit 160 including active circuit, in some embodiments, the circuit 160 includes at least one digital circuit, such as logic gates, digital processing circuits, etc. In some other embodiments, the circuit 160 includes at least one analog circuit, such as amplifiers, mixers, radio frequency circuits, etc. In various embodiments, the circuit 160 includes at least one mixed-signal circuit, such as analog-to-digital converters (ADC), digital-to-analog-converters (DAC), or a circuit implemented with the combination of aforementioned active circuits. The aforementioned configurations in the circuit 160 are given for illustrative purposes. Various configurations of the circuit 160 are within the contemplated scope of the present disclosure.

Furthermore, for illustration, the filters 180 are coupled to the power distribution network 120. The filters 180 are configured to suppress AC signals including, for example, noises, from the power distribution network 120. In some embodiments, each one of the filters 180 includes an electromagnetic bandgap (EBG) structure (not shown). In further embodiments, the electromagnetic bandgap structure is formed by LC circuits, in which the LC circuits are periodically arranged to define different bandwidths for filtering noises. Alternatively stated, noises are not allowed to propagate within the power distribution network 120 due to the electromagnetic bandgap structure. With the arrangement illustrated in FIG. 1, noises including, for example, ground bounce noise (GBN), which is also known as simultaneous switching noise (SSN), in the power distribution network 120, are reduced. As a result, signal integrity and power integrity of the power distribution network 120 are improved.

In addition, in various embodiments, each one of the filters 180 is configured to provide an electrostatic discharge (ESD) protection for the circuit 160 when an ESD event occurs in the power distribution network 120. Accordingly, operational reliability of the electronic device 100 is improved. Detailed operations related to the filters 180 are described in the following paragraphs.

The arrangements of the electronic device 100 and the numbers of the filters 180 in FIG. 1 are given for illustrative purposes. Various arrangements of the electronic device 100 and various numbers of the filters 180 are within the contemplated scope of the present disclosure.

Various embodiments related to the filter 180 are described below with reference to FIG. 2, FIG. 4, and FIG. 6. The present disclosure is not limited to the following embodiments. Various embodiments are within the contemplated scope of the present disclosure.

Figure 2:
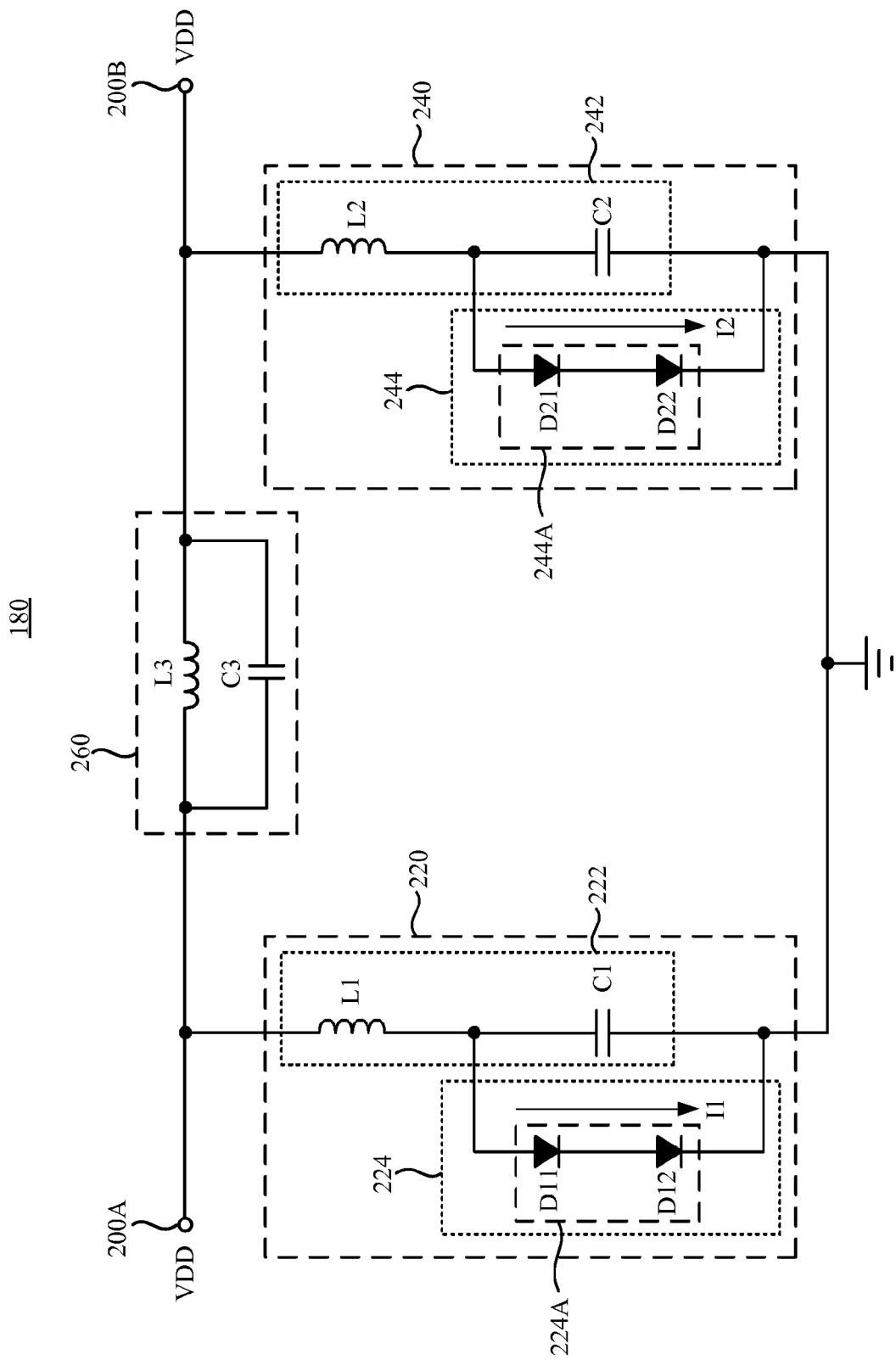
FIG. 2 is a schematic diagram of the filter illustrated in FIG. 1, in accordance with some embodiments of the present disclosure.

Reference is now made to FIG. 2. FIG. 2 is a schematic diagram of the filter 180 illustrated in FIG. 1, in accordance with some embodiments of the present disclosure.

As illustratively shown in FIG. 2, the filter 180 includes a resonant network 220, a resonant network 240, and a resonant network 260. The filter 200 includes a transmission terminal 200A and a transmission terminal 200B. The transmission terminal 200A and the transmission terminal 200B are coupled to the power distribution network 120 illustrated in FIG. 1, to receive the system voltage VDD. The resonant network 220, the resonant network 240, and the resonant network 260 are cooperated to set bandwidth of the filter 200.

The resonant network 220 is coupled to the transmission terminal 200A. The resonant network 220 is configured to filter noises from the power distribution network 120, and to provide an electrostatic discharging protection for ESD events occurred in the resonant network 120. For illustration, ESD events occur at the transmission terminal 200A, and the resonant network 220 performs electrostatic discharging protection for ESD events at the transmission terminal 200A.

The resonant network 240 is coupled to the transmission terminal 200B. The resonant network 240 is configured to filter noises from the power distribution network 120, and to provide another electrostatic discharging protection for ESD events occurred in the resonant network 120. For illustration, ESD events occur at the transmission terminal 200B, and the resonant network 240 performs electrostatic discharging protection for ESD events at the transmission terminal 200B.

The resonant network 260 is configured to filter noises from the power distribution network 120 through the transmission terminal 200A or 200B. For illustration, the ESD events occur at the transmission terminal 200A or 200B when the power distribution network 120 is in contact with other circuits, a human body, or a testing machine.

In some embodiments, the resonant network 220 includes an LC circuit 222 and an ESD protection circuit 224. The LC circuit 222 is configured to filter noises from the power distribution network 120. The LC circuit 222 includes an inductor L1 and a capacitor C1. A first terminal of the inductor L1 is coupled to the transmission terminal 200A. A second terminal of the inductor L1 is coupled to a first terminal of the capacitor C1 and the ESD protection circuit 224. A second terminal of the capacitor C1 is coupled to ground.

In some embodiments, the ESD protection circuit 224 includes a diode string 224A. The diode string 224A includes N diodes that are coupled in series, in which N is a positive integer. The diode string 224A is coupled in parallel with the capacitor C1. For illustration, the diode string 224A includes a diode D11 and a diode D12. An anode of the diode D11 is coupled to the transmission terminal 200A through the inductor L1, and a cathode of the diode D11 is coupled to an anode of the diode D12. A cathode of the diode D12 is coupled to ground.

In operation, the diode string 224A is normally off. When the ESD events occur at the transmission terminal 200A, the diode string 224A is forward biased and conducted. Accordingly, the diode string 224A is able to provide an electrostatic discharging path for the ESD events corresponding to the transmission terminal 200A.

For simplicity, the diodes D11 and D12 are illustrated in the diode string 224A, but various numbers of diodes in the diode string 224A are contemplated within the scope of the present disclosure.

Further, the resonant network 240 includes an LC circuit 242 and an ESD protection circuit 244. The LC circuit 242 is configured to filter noises from the power distribution network 120. The LC circuit 242 includes an inductor L2 and a capacitor C2. A first terminal of the inductor L2 is coupled to the transmission terminal 200B. A second terminal of the inductor L2 is coupled to a first terminal of the capacitor C2 and the ESD protection circuit 244. A second terminal of the capacitor C2 is coupled to ground.

In some embodiments, the ESD protection circuit 244 includes a diode string 244A. The diode string 244A includes N diodes that are coupled in series. The diode string 244A is coupled in parallel with the capacitor C2. For illustration, the diode string 244A includes a diode D21 and a diode D22. An anode of the diode D21 is coupled to the transmission terminal 200B through the inductor L2, and a cathode of the diode D21 is coupled to an anode of the diode D22. A cathode of the diode D22 is coupled to ground.

In operation, the diode string 244A is normally off. When the ESD events occur at the transmission terminal 200B, the diode string 244A is forward biased and conducted. Accordingly, the diode string 244A is able to provide the electrostatic discharging path for the ESD events corresponding to transmission terminal 200B.

For simplicity, the diodes D21 and D22 are illustrated in the diode string 244A, but various numbers of diodes in the diode string 244A are contemplated within the scope of the present disclosure.

The number of diodes in the diode string 224A and the diode string 244A in FIG. 2 is given for illustrative purposes. Various numbers of diodes in the diode string 224A and the diode string 244A are able to be adjusted according to a threshold voltage of each diode and the system voltage VDD. For illustration, a threshold voltage of each of diodes is about 0.6 Volts, and the system voltage VDD is configured to be about 1 Volts. To prevent the diode string 224A from being normally turned on by the system voltage VDD, at least two diodes, which have a voltage drop of at least 1.2 Volts, are used in the diode string 224A. Similarly, at least two diodes are used in the diode string 244A as well.

The arrangements and detail circuits of the ESD protection circuit 224 and the ESD protection circuit 244 in FIG. 2 are given for illustrative purposes. Various arrangements and detail circuits of the ESD protection circuit 224 and the ESD protection circuit 244 are within the contemplated scope of the present disclosure.

As illustratively shown in FIG. 2, the resonant network 260 includes an inductor L3 and a capacitor C3. A first terminal of the inductor L3 is coupled to the transmission terminal 200A, and a second terminal of the inductor L3 is coupled to the transmission terminal 200B. The capacitor C3 is coupled between the transmission terminal 200A and the transmission terminal 200B, and is coupled in parallel with the inductor L3.

In some embodiments, the resonant network 220, the resonant network 240, and the resonant network 260 operate together as a band-stop filter. A bandwidth of the band-stop filter is able to be adjusted according to the frequency of the noises desired to be filtered. Explained in a different way, the bandwidth of the band-stop filter is related to a resonant frequency of each one of the resonant network 220, the resonant network 240, and the resonant network 260. The resonant frequency of the resonant network 220 is determined by an inductance value of the inductor L1 and a capacitance value of the capacitor C1. The resonant frequency of the resonant network 240 is determined by an inductance value of the inductor L2 and a capacitance value of the capacitor C2. The resonant frequency of the resonant network 260 is determined by an inductance value of the inductor L3 and a capacitance value of the capacitor C3. Accordingly, the inductance values of the inductor L1, the inductor L2, and the inductor L3 and the capacitance values of the capacitor C1, the capacitor C2, and the capacitor C3 are determined according to the frequency of the noises from the power distribution network 120. As a result, with the resonant networks 220, 240 and 260 that operate together as a band-stop filter, the noises are filtered by the filter 200. Accordingly, power integrity of the system voltage VDD transmitted through the power distribution network 120 is improved.

As mentioned above, the diode string 224A and the diode string 244A are configured to be normally off. When the diode string 224A is turned off, a parasitic capacitance is effectively formed by the diode string 224A. When the diode string 244A is turned off, a parasitic capacitance is effectively formed by the diode string 244A. In some embodiments, the resonant frequency of the resonant network 220 is determined by the inductance value of the inductor L1, the capacitance value of the capacitor C1, and the parasitic capacitance value of the diode string 224A. Similarly, the resonant frequency of the resonant network 240 is determined by the inductance value of the inductor L2, the capacitance value of the capacitor C2, and the parasitic capacitance value of the diode string 244A. Alternatively stated, the number of the diodes in the diode string 224A and diode string 244A are determined, in some embodiments, according to the desired capacitance values of the parasitic capacitance values. The bandwidth of the filter 200 is able to be adjusted accordingly.

In some embodiments, the capacitor C1, the capacitor C2, and the capacitor C3 are implemented with different on-chip devices. In some other embodiments, the capacitor C1, the capacitor C2, and the capacitor C3 are implemented with metal-oxide-metal (MOM) capacitors. In some alternative embodiments, the capacitor C1, the capacitor C2, and the capacitor C3 are implemented with metal-insulator-metal (MIM) capacitors. In alternative embodiments, the capacitor C1, the capacitor C2, and the capacitor C3 are implemented with metal-oxide-semiconductor field-effect transistors (MOSFET). In yet alternative embodiments, the capacitor C1, the capacitor C2, and the capacitor C3 are implemented with MOS varactors. In various embodiments, the capacitor C1, the capacitor C2, and the capacitor C3 are implemented with the combination of the aforementioned devices.

The aforementioned devices to realize the capacitors C1, C2, and C3 are given for illustrative purposes. Various devices used to realize the capacitor C1, the capacitor C2, and the capacitor C3 are within the contemplated scope of the present disclosure.

Similarly, in some embodiments, the inductor L1, the inductor L2, and the inductor L3 are implemented with different on-chip devices. In further embodiments, the inductor L1, the inductor L2, and the inductor L3 are implemented with planar spiral inductors. In various embodiments, the inductor L1, the inductor L2, and the inductor L3 are implemented with thin film type inductors.

The aforementioned devices to realize the inductors L1, L2, and L3 are given for illustrative purposes. Various devices used to realize the inductors L1, L2, and L3 are within the contemplated scope of the present disclosure.

With implementing appropriate on-chip devices, the inductance values of the inductor L1, the inductor L2, and the inductor L3 are able to be reduced, and the capacitance values of the capacitor C1, the capacitor C2, and the capacitor C3 are also able to be reduced. Effectively, the bandwidth of the filter 400 is thus broadened. As a result, the filter 180 is able to filter noises having a relatively high frequency, e.g., radio frequency.

The arrangement of the filter 180 in FIG. 2 is given for illustrative purposes. Various arrangements of the filter 180 are within the contemplated scope of the present disclosure.

Figure 3:
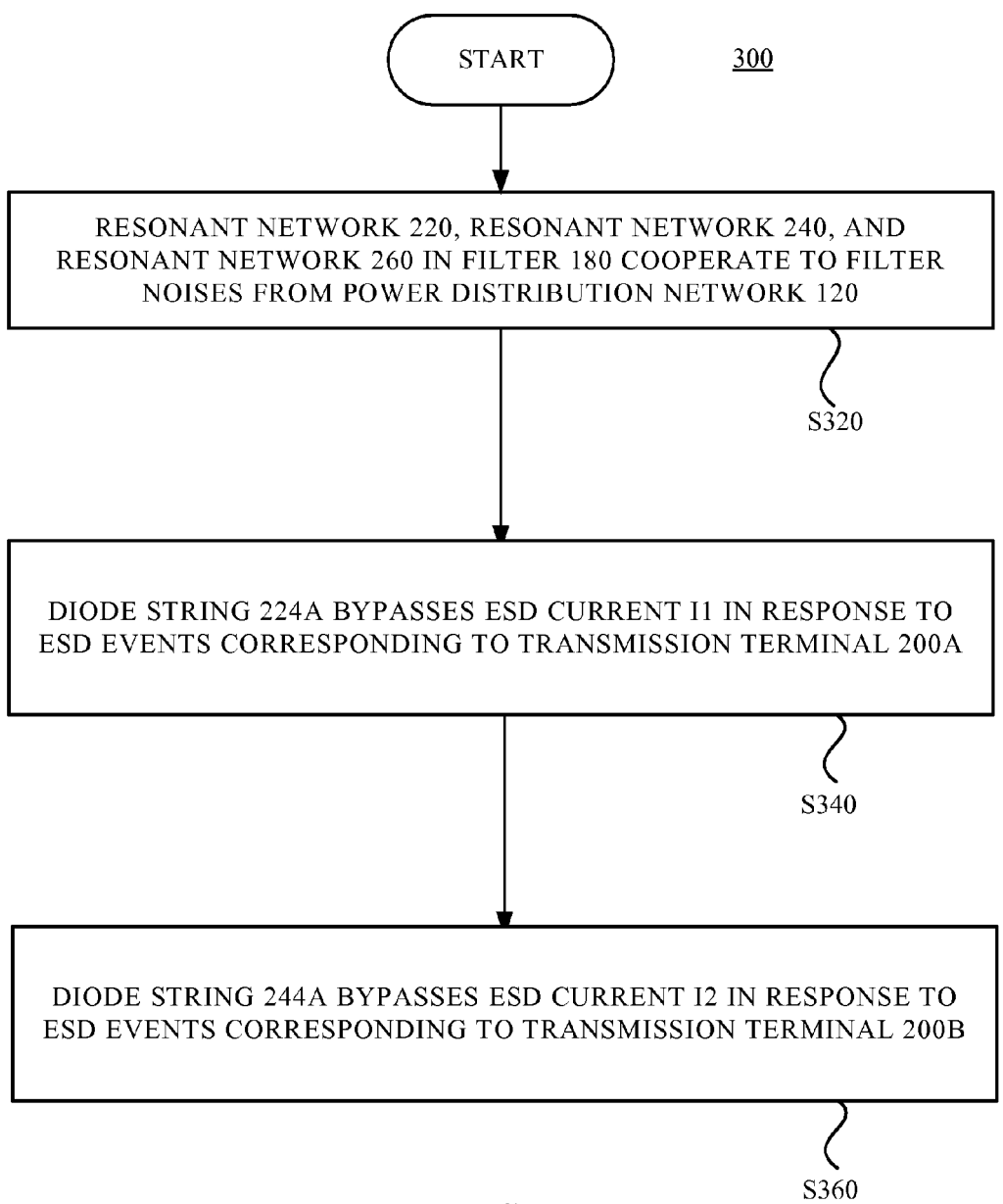
FIG. 3 is a flow chart of a filtering method illustrating operations of the filter in FIG. 2, in accordance with some embodiments of the present disclosure.

FIG. 3 is a flow chart of a filtering method 300 illustrating operations of the filter 180 in FIG. 2, in accordance with some embodiments of the present disclosure. The operations of the filter 180 in FIG. 2 are described below by the filtering method 300 with reference to FIG. 1 and FIG. 2.

In operation S320, the resonant network 220, the resonant network 240, and the resonant network 260 in the filter 180 cooperate to filter noises from the power distribution network 120. For illustration, the resonant network 220, the resonant network 240, and the resonant network 260 cooperate as a band-stop filter.

In operation S340, the diode string 224A bypasses an ESD current I1 in response to ESD events corresponding to the transmission terminal 200A.

In operation S360, the diode string 244A bypasses an ESD current I2 in response to ESD events corresponding to the transmission terminal 200B.

For illustration, the diode string 224A is forward biased and conducted when the ESD events occur at the transmission terminal 200A that is coupled to the power distribution network 120. Effectively, the diode string 224A provides the electrostatic discharging path to bypass the ESD current I1 to ground. Similarly, the diode string 244A is forward biased and conducted when the ESD events occur at the transmission terminal 200B that is coupled to the power distribution network 120. The diode string 244A provides the electrostatic discharging path to bypass the ESD current I2 to ground. Accordingly, the filter 180 not only suppresses the noises from the power distribution network 120 but also provides ESD protections for the power distribution network 120. As a result, the power integrity of the system voltage VDD is improved, and the reliability of the electronic device 100 is increased.

The above illustrations include exemplary operations, but the operations are not necessarily performed in the order shown in FIG. 3. Operations may be added, replaced, changed order, and/or eliminated as appropriate, in accordance with the spirit and scope of various embodiments of the present disclosure.

Figure 4:
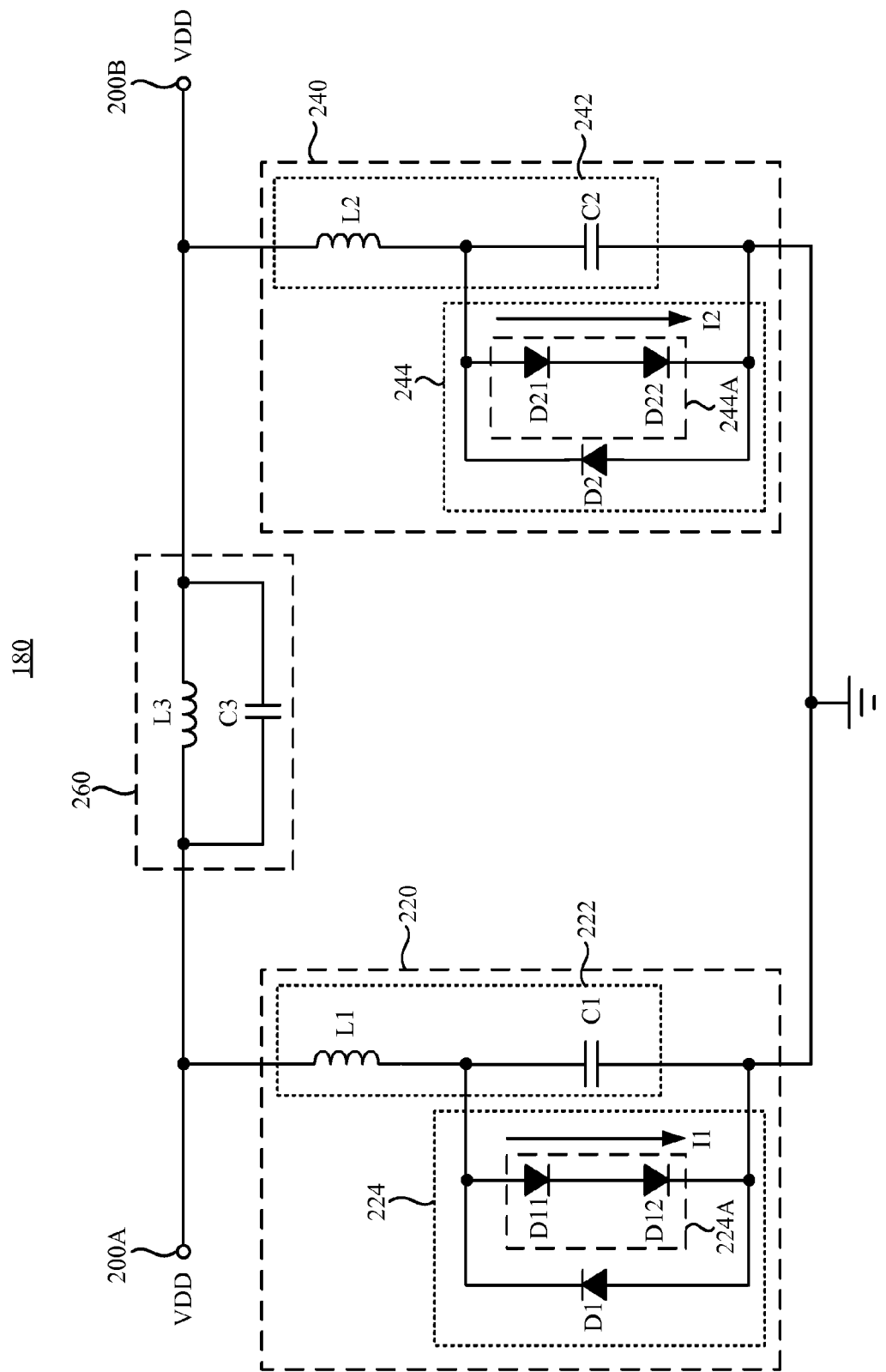
FIG. 4 is a schematic diagram of the filter illustrated in FIG. 1, in accordance with some other embodiments of the present disclosure.

Reference is now made to FIG. 4. FIG. 4 is a schematic diagram of the filter 180 illustrated in FIG. 1, in accordance with some other embodiments of the present disclosure.

In some embodiments, as illustratively shown in FIG. 4, compared to the filter 180 in FIG. 2, the ESD protection circuit 224 of the filter 400 further includes a diode D1, and the ESD protection circuit 244 further includes a diode D2. The diode D1 is coupled in anti-parallel with the diode string 224A, and the diode D2 is coupled in anti-parallel with the diode string 244A. For illustration, an anode of the diode D1 is coupled to ground, and a cathode of the diode D1 is coupled to the second terminal of the inductor L1. An anode of the diode D2 is coupled to ground, and a cathode of the diode D2 is coupled to the second terminal of the inductor L2. The diode D1 and the diode D2 are configured to be reverse-biased. Effectively, the diode D1 provides an additional electrostatic discharging path, and the diode D2 provides another additional electrostatic discharging path.

In operation, when ESD events occur at the terminals that are coupled to ground or the power distribution network 140 in FIG. 1, ESD current is bypassed through at least one of the diode D1 and the diode D2. Effectively, the diode string 224A and the diode string 244A provide ESD protection for positive ESD events in the power distribution network 120, and the diode D1 and the diode D2 provide ESD protection for negative ESD events in the power distribution network 140. As a result, the ESD protection is further improved, and the reliability of the filter 400 is further improved as well.

In some embodiments, at least one of the diode D1 and the diode D2 is replaced with a diode string. In other words, the arrangements and the numbers of the diode D1 and the diode D2 are given only for illustrative purposes. Diode strings that have various numbers of diodes are able to replace the diodes D1 and D2, and are within the contemplated scope of the present disclosure.

Figure 5:
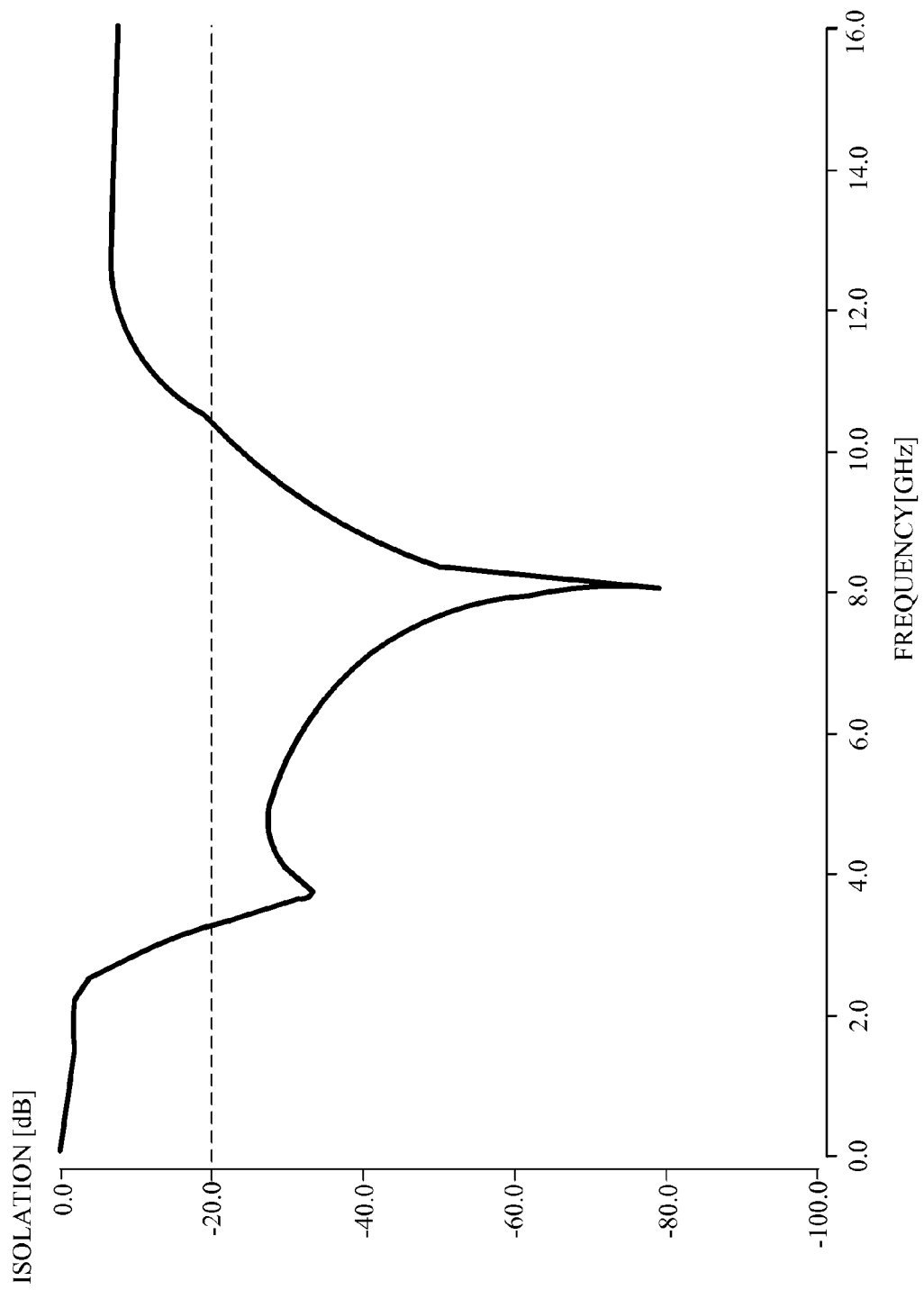
FIG. 5 is a graph illustrating a simulation result of an isolation performed by the filter in FIG. 4, in accordance with some embodiments of the present disclosure.

Reference is now made to FIG. 5. FIG. 5 is a graph illustrating a simulation result of an isolation performed by the filter 180 in FIG. 4, in accordance with some embodiments of the present disclosure.

In FIG. 5, the isolation between the transmission terminal 200B and the transmission terminal 200A of the filter 180 is simulated by using S-parameters, such as insertion loss. As shown in FIG. 5, a −20 dB of the isolation between the transmission terminal 200B and the transmission terminal 200A is able to be achieved within the frequency range of about 3.3-10.3 gigahertz (GHz). In other words, the bandwidth of a stop-band of the filter 180 ranges from about 3.3 GHz to about 10.3 GHz. Within the range of from about 3.3 GHz to about 10.3 GHz, the noises are suppressed. Effectively, as the stop-band of the filter 180 corresponds to a frequency band of microwave, not only ground bound noises are filtered, but also other undesired effects including, for example, inter-symbol interference (ISI), crosstalk, electromagnetic interference (EMI), etc., are suppressed. As a result, the power integrity of the power distribution network 120 is improved.

Figure 6:
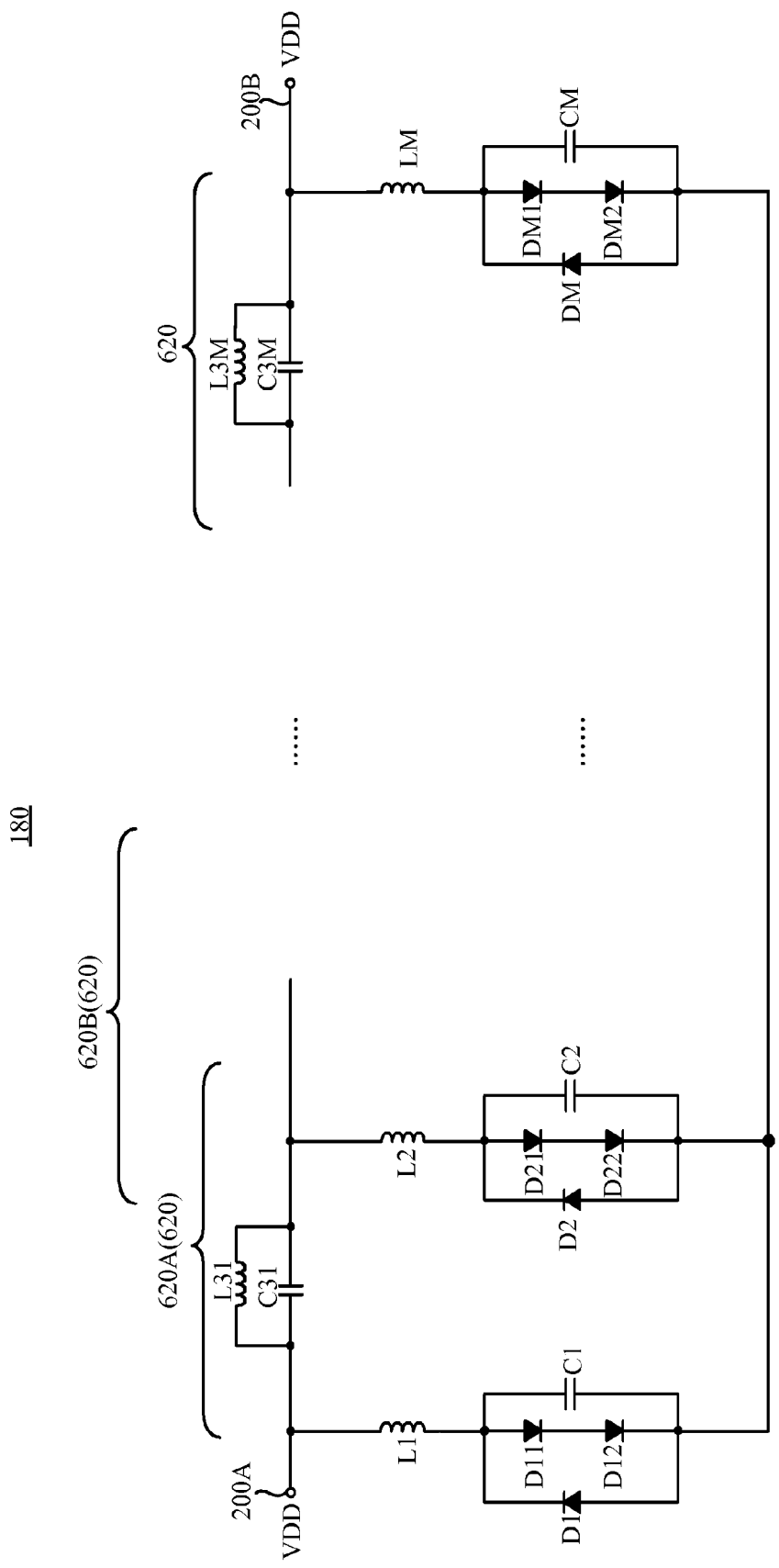
FIG. 6 is a schematic diagram of the filter illustrated in FIG. 1, in accordance with some alternative embodiments of the present disclosure.

Reference is now made to FIG. 6. FIG. 6 is a schematic diagram of the filter 180 illustrated in FIG. 1, in accordance with some alternative embodiments of the present disclosure.

In some embodiments, compared to FIG. 4, the filter 180 in FIG. 6 includes M filter circuit structures 620, in which M is a positive integer. The M filter circuit structures 620 are periodically coupled in cascade. Each one of the M filter circuit structures 620 is formed with the resonant network 220, the resonant network 240, and the resonant network 260 shown in FIG. 4. In various embodiments, each one of the M filter circuit structures 620 is formed with the resonant network 220, the resonant network 240, and the resonant network 260 shown in FIG. 2. Therefore, various configurations of the filter circuit structure 620 in FIG. 6 are within the contemplated scope of the present disclosure.

In some embodiments, as illustratively shown in FIG. 6, the filter 180 includes diodes D1-DM, D11-DM1 and D12-DM2, capacitors C1-CM and C31-C3M, and inductors L1-LM and L31-L3M. The arrangements and operations of the inductor L1, the capacitor C1, and the diodes D1, D11 and D12 are similar to those in the resonant network 220 as illustrated in FIG. 4. The arrangements and operations of the inductor L2, the capacitor C2, and diodes D2, D21 and D22 are similar to those in the resonant network 240 as illustrated in FIG. 4. The arrangements and operations of the inductor L3 and the capacitor C3 are similar to those in the resonant network 260 as illustrated in FIG. 4. The arrangements and operations of the rest components are deduced by analogy. Therefore, arrangements and operations of the diodes D1-DM, D11-DM1 and D12-DM2, the capacitors C1-CM and C31-C3M, and the inductors L1-LM and L31-L3M are not further detailed herein.

In some other embodiments, each one of the diode strings including the diodes D11-D12, D21-D22, . . . , DM1-DM2, respectively, is able to be replaced with a diode string that includes N diodes, where N is larger than 2. The configuration of the filter 180 in FIG. 6 is given for illustrative purposes. Various configurations of the filter 180 in FIG. 6 are within the contemplated scope of the present disclosure.

In some embodiments, the circuits in FIG. 6, corresponding to the resonant network 220 and the resonant network 240 in FIG. 4, have the same circuit arrangement. In further embodiments, the inductance values of the inductor L1 and the inductor L2 are the same, and the capacitance values of the capacitor C1 and the capacitor C2 are the same. Accordingly, adjacent two of the M filter circuit structures 620 are configured to share one of the resonant network 220 and the resonant network 240. For illustration in FIG. 6, the filter circuit structure 620A and the filter circuit structure 620B share the resonant network 240 which includes the inductor L2, the diodes D2, D21, and D22, and the capacitor C2. Accordingly, a modular design for implementing the resonant network 220 and the resonant network 240 is achieved. As a result, the bandwidth of the filter 600 is able to be adjusted in a more efficient way, compared to other approaches without modular design.

In some embodiments, the number M is determined according to requirements of practical application. For illustration, as the number M increases, an order of the filter 180 becomes higher, and an attenuation of noises within the stop-band of the filter 180 is increased. Effectively, by providing several filters 180 for the power distribution network 120, the noises from the power distribution network 120 are significantly suppressed.

As described above, the electronic device and the filter of the present disclosure are able to be applied in a high speed system. The filter is able to suppress the noises from a power distribution network, and is able to provide ESD protection for the power distribution network. As a result, the power integrity of the power distribution network is improved, and a reliability of overall system is also improved.

In this document, the term "coupled" may also be termed as "electrically coupled," and the term "connected" may be termed as "electrically connected". "Coupled" and "connected" may also be used to indicate that two or more elements cooperate or interact with each other.

In some embodiments, an electronic device is disclosed that includes a power distribution network, a first resonant network, a second resonant network, and a third resonant network. The power distribution network is configured to transmit a voltage. The first resonant network is coupled to a first terminal of the power distribution network, and is configured to provide a first electrostatic discharging protection to the power distribution network. The second resonant network is coupled to a second terminal of the power distribution network, and being configured to provide a second electrostatic discharging a second ESD protection to the power distribution network. The third resonant network is coupled between the first terminal and the second terminal of the power distribution network, and the first resonant network, the second resonant network, and the third resonant network are configured to filter an AC signal from the power distribution network.

Also disclosed is an electronic device that includes filter circuit structures coupled in cascaded. A first filter circuit structure of the filter circuit structures includes a resonant network, a first inductor, a second inductor, a first electrostatic discharging protection circuit, a second electrostatic discharging protection circuit, a first capacitor, and a second capacitor. The resonant network is coupled between a first terminal and a second terminal of the first filter circuit structure. A first terminal of the first inductor is coupled to the first terminal of the first filter circuit structure. A first terminal of the second inductor is coupled to the second terminal of the first filter circuit structure. A first electrostatic discharging protection circuit is coupled between a second terminal of the first inductor and ground. The second electrostatic discharging protection circuit is coupled between a second terminal of the second inductor and ground. The first capacitor is coupled in parallel with the first electrostatic discharging protection circuit. The second capacitor is coupled in parallel with the second electrostatic discharging protection circuit.

Also disclosed is a method that includes the operations below. AC signals in a power distribution network are filtered by a filter. A first electrostatic discharging current is bypassed by a first electrostatic discharging path of the filter in response to electrostatic discharging events corresponding to a first transmission terminal of the filter which is coupled to the power distribution network. A second electrostatic discharging current by a second electrostatic discharging path of the filter in response to electrostatic discharging events corresponding to a second transmission terminal the filter which is coupled to the power distribution network.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An electronic device, comprising:
   a power distribution network configured to transmit a voltage;
   a first resonant network coupled to a first terminal of the power distribution network, and being configured to provide a first electrostatic discharge (ESD) protection to bypass a first ESD current;
   a second resonant network coupled to a second terminal of the power distribution network, and being configured to provide a second ESD protection to bypass a second ESD current; and
   a third resonant network coupled between the first terminal and the second terminal of the power distribution network, and the first resonant network, the second resonant network, and the third resonant network being configured to filter an AC signal from the power distribution network.

2. The electronic device of claim 1, wherein the first resonant network comprises:
   an LC circuit configured to filter the AC signal in the power distribution network; and
   an electrostatic discharging protection circuit coupled to the LC circuit, and being configured to provide a first electrostatic discharging path for bypassing the first ESD current in response to first ESD events corresponding to the first terminal of the power distribution network.

3. The electronic device of claim 2, wherein the electrostatic discharging protection circuit comprises:
   a first diode coupled between the LC circuit and ground, and being configured to be normally off.

4. The electronic device of claim 3, wherein the electrostatic discharging protection circuit further comprises:
   a second diode coupled in parallel with the first diode, and being configured to be reverse biased.

5. The electronic device of claim 1, wherein the first resonant network comprises:
   an inductor, a first terminal of the inductor is coupled to the first terminal of the power distribution network;
   a diode string coupled between a second terminal of the inductor and ground; and
   a capacitor coupled in parallel with the diode string.

6. The electronic device of claim 5, wherein the first resonant network further comprises:
   a diode, an anode of the diode being coupled to ground, and a cathode of the diode being coupled to the second terminal of the inductor.

7. The electronic device of claim 1, wherein the second resonant network comprises:
   an LC circuit configured to filter the AC signal in the power distribution network; and
   an electrostatic discharging protection circuit coupled to the LC circuit, and being configured to provide a second electrostatic discharging path for bypassing the second ESD current in response to second ESD events corresponding to the second terminal of the power distribution network.

8. The electronic device of claim 7, wherein the electrostatic discharging protection circuit comprises:
   a first diode coupled between the LC circuit and ground, and being configured to be normally off.

9. The electronic device of claim 8, wherein the electrostatic discharging protection circuit further comprises:
   a second diode coupled in parallel with the first diode, and being configured to be reverse biased.

10. The electronic device of claim 1, wherein the second resonant network comprises:

an inductor, and a first terminal of the inductor being coupled to the second terminal of the power distribution network;

an diode string coupled between a second terminal of the inductor and ground; and a capacitor coupled in parallel with the diode string.

11. The electronic device of claim 10, wherein the second resonant network further comprises:

a diode, an anode of the diode being coupled to ground, and a cathode of the diode being coupled to the second terminal of the inductor.

12. The electronic device of claim 1, wherein the third resonant network comprises:

an inductor coupled between the first terminal and the second terminal of the power distribution network; and a capacitor coupled to the inductor in parallel.

13. An electronic device, comprising:

a plurality of filter circuit structures coupled in cascade, wherein a first filter circuit structure of the filter circuit structures comprises:

a resonant network coupled between a first terminal and a second terminal of the first filter circuit structure;

a first inductor, a first terminal of the first inductor being coupled to the first terminal of the first filter circuit structure;

a second inductor, a first terminal of the second inductor being coupled to the second terminal of the first filter circuit structure;

a first electrostatic discharging protection circuit coupled between a second terminal of the first inductor and ground;

a second electrostatic discharging protection circuit coupled between a second terminal of the second inductor and ground;

a first capacitor coupled in parallel with the first electrostatic discharging protection circuit; and a second capacitor coupled in parallel with the second electrostatic discharging protection circuit.

14. The electronic device of claim 13, wherein the first electrostatic discharging protection circuit comprises:

a first diode, an anode of the first diode being coupled to the second terminal of the first inductor, and a cathode of the first diode being coupled to ground.

15. The electronic device of claim 14, wherein the first electrostatic discharging protection circuit further comprises:

a second diode, an anode of the second diode being coupled to ground, and a cathode of the second diode being coupled to the second terminal of the first inductor.

16. The electronic device of claim 13, wherein the second electrostatic discharging protection circuit comprises:

a first diode, an anode of the first diode being coupled to the second terminal of the second inductor, and a cathode of the first diode being coupled to ground.

17. The electronic device of claim 16, wherein the second electrostatic discharging protection circuit further comprises:

a second diode, an anode of the second diode being coupled to ground, and a cathode of the second diode being coupled to the second terminal of the second inductor.

18. The electronic device of claim 13, wherein the first capacitor and the second capacitor are on-chip capacitors.

19. A method, comprising:

filtering AC signals, by a filter, in a power distribution network;

bypassing a first electrostatic discharging current, by a first electrostatic discharging path of the filter, in response to electrostatic discharging events corresponding to a first transmission terminal of the filter which is coupled to the power distribution network; and bypassing a second electrostatic discharging current, by a second electrostatic discharging path of the filter, in response to electrostatic discharging events corresponding to a second transmission terminal of the filter which is coupled to the power distribution network.

20. The method of claim 19, further comprising:

forward-biasing a first diode of the filter to provide the first electrostatic discharging path; and forward-biasing a second diode of the filter to provide the second electrostatic discharging path.

* * * * *